US006275511B1

United States Patent
Pan et al.

(10) Patent No.: US 6,275,511 B1
(45) Date of Patent: Aug. 14, 2001

(54) OVERLAPPING MULTIPLE FIBER BRAGG GRATINGS

(75) Inventors: Jing-Jong Pan, Milpitas; Yuan Shi, San Jose, both of CA (US)

(73) Assignee: E-Tek Dynamics, San Jose, CA (US)

( * ) Notice: Subject to any disclaimer, the term of this patent is extended or adjusted under 35 U.S.C. 154(b) by 0 days.

(21) Appl. No.: 09/114,309

(22) Filed: Jul. 13, 1998

(51) Int. Cl.$^7$ ........................................ H01S 3/30
(52) U.S. Cl. ........................ 372/6; 372/6; 372/102; 372/34; 372/96; 372/101; 372/99
(58) Field of Search ................... 372/6, 102, 75, 372/34, 99, 101, 96

(56) References Cited

U.S. PATENT DOCUMENTS

| | | | |
|---|---|---|---|
| 5,208,876 | * 5/1993 | Pan | 385/11 |
| 5,317,576 | * 5/1994 | Leonberger et al. | 372/6 |
| 5,699,377 | 12/1997 | Pan | 372/92 |
| 5,812,712 | * 9/1998 | Pan | 385/37 |
| 5,844,927 | * 12/1998 | Kringlebotn | 372/6 |
| 6,018,534 | * 1/2000 | Pan et al. | 372/6 |
| 6,044,093 | * 3/2000 | Ventrudo et al. | 372/6 |

OTHER PUBLICATIONS

R.W. Fallon, "Multiplexed Identical Braod–Band–Chirped Grating Interrogation system for Large–Strain Sensing Application" Dec. 1997, IEEE Photonics Technology Latter, vol. 9, No. 12, Pag. 1616–18.*
Y. Zhao, "A Novel Bidirectional Add/Drop Module Using Waveguide Grating Routers and Wavelength Channel Matched Fiber Gratings", Sep. 1999, IEEE Photonics Latters, vol. 11, No. 9, Pag 1180–82.*
U.S. application No. 08/920,375, Pan et al., filed Aug. 29, 1997.
Ball et al., "Nd$^{3+}$ Fibre Laser Utilising Intra–Core Bragg Reflectors," *Electronics Letters* (1990) 26:1829–1830.
Kashyap et al., "All–Fibre Narrowband Reflection Gratings at 1500 nm," *Electronics Letters* (1990) 26:730–731.
Ball et al., "Standing–Wave Monomode Erbium Fiber Laser," *IEEE Photonics Technology Letters* (1991) ??:613–615.
Sejka et al., "Distributed feedback Er$^{3+}$–doped fibre laser," *Electronics Letters* (1995) 31:1445–1446.
Agrawal, *Nonlinear Fiber Optics,* Second Edition, Chapter 12, pp. 539–540, Academic Press, (1995).

* cited by examiner

Primary Examiner—Frank G. Font
Assistant Examiner—Delma R. Flores Ruiz
(74) Attorney, Agent, or Firm—Townsend and Townsend and Crew LLP

(57) ABSTRACT

Overlapping multiple fiber Bragg gratings for reflecting light in a plurality of wavelength each with a selected narrow linewidth are described. Each fiber Bragg grating has a selected period so as to reflect light in a wavelength with a selected narrow linewidth. The overlapping multiple fiber Bragg gratings can be used in various applications, including a multiwavelength laser source. One embodiment of a multiwavelength laser source includes a laser diode having first and second facets from which output light is emitted and an optical fiber section having an end located near the second facet to receive output light from the laser diode. The optical fiber section includes overlapping multiple fiber Bragg gratings for reflecting output light in the wavelengths with selected narrow linewidths back into the laser diode through its second facet. The output light emitted from the first facet has very narrow linewidths about the selected linewidths.

23 Claims, 7 Drawing Sheets

OVERLAPPING MULTIPLE FIBER BRAGG GRATINGS

BACKGROUND OF THE INVENTION

The present invention is related to the field of optical fiber networks, and more particularly, to multiple fiber Bragg gratings which can be used in optical fiber networks.

In fiber optics, semiconductor lasers provide the only practical source of light signals for optical fiber networks. Narrow linewidth semiconductor laser sources are highly desirable in applications such as WDM (Wavelength Division Multiplexing) networks. In a WDM network, the wavelength of optical signals is used to direct the signals from its source to the desired destination. Hence the narrow linewidths provided by the narrow linewidth semiconductor laser sources allow a large number of communication channels to operate over the network. Narrow linewidth light sources are required, for instance, in a Dense WDM network standard with channels having a separation of 100 GHz frequency (or 0.8 nm wavelength) which the International Telecommunications Union (ITU) has proposed.

One type of laser source is found in U.S. Pat. No. 5,699,377, entitled NARROW LINEWIDTH, STABILIZED SEMICONDUCTOR LASER SOURCE to J. J. Pan, which discloses a narrow linewidth semiconductor laser diode source having a laser diode and a fiber Bragg grating. The laser diode has first and second facets from which output light is emitted. A first end of the fiber Bragg grating is located near the second facet to receive output light from the laser diode. The fiber Bragg grating has a very narrow reflection band about a selected wavelength and reflects output light in a selected narrow linewidth back into the laser diode through its second facet. The output light emitted from the first facet has a very narrow linewidth about the selected linewidth. The entire disclosure of this patent is incorporated herein by reference.

Because laser diode sources are expensive, it is desirable to produce a laser diode source with multiwavelength outputs. To provide multiwavelength outputs of different narrow linewidths, a plurality of fiber Bragg gratings which reflect light at the different wavelengths can be provided near the second facet of the laser diode. Cascading multiple, spaced fiber Bragg gratings in series is more practical than constructing the fiber Bragg gratings in parallel because of the problem of interfacing the input and output light in a parallel structure. Parallel fiber Bragg gratings also require multiple laser diodes. A cascading multiple fiber Bragg gratings structure has certain disadvantages. These include long physical length which requires a long package size and insertion loss due to fusion of the fiber Bragg gratings in series. Moreover, it is difficult to make a temperature compensated package.

SUMMARY OF THE INVENTION

The present invention presents arrangements of multiple fiber Bragg gratings which avoid these problems and disadvantages. In a specific embodiment, multiple fiber Bragg gratings are overlapped with each other at the same location of an optical fiber for reflecting light in a plurality of wavelengths with selected narrow linewidths. The overlapping arrangement provides a compact, efficient structure for reflecting light not only in a multiwavelength laser diode source, but in other applications as well. For instance, the overlapping multiple fiber Bragg gratings of the present invention can be used for making more compact and efficient multiwavelength fiber lasers in a fiberoptic network than those disclosed in U.S. Patent Application entitled, "MULTIWAVELENGTH FIBER LASER SOURCES FOR FIBEROPTIC NETWORKS," which was filed on Aug. 29, 1997 and assigned Ser. No. 08/920,375. This application is assigned to E-Tek Dynamics, Inc., the assignee of the current application, and is hereby incorporated by reference in its entirety. Examples of other applications of the overlapping multiple fiber Bragg gratings of the present invention include multiwavelength reflector or resonator, wavelength multiplexer/demultiplexer, and optical signal processing.

In accordance with an embodiment of the present invention, an optical fiber section comprises a plurality of fiber Bragg gratings. Each fiber Bragg grating reflects light in a selected narrow linewidth at a different wavelength. At least two of the fiber Bragg gratings overlap each other in the optical fiber section.

In accordance with another embodiment of the invention, an optical fiber section comprises a plurality of fiber Bragg gratings. Each fiber Bragg grating has a selected period so as to reflect light in a wavelength with a selected narrow linewidth. At least two of the fiber Bragg gratings overlap each other in the optical fiber section.

Another embodiment of this invention is directed to semiconductor laser source comprising a laser diode having first and second facets from which output light is emitted. An optical fiber section has a plurality of fiber Bragg gratings. Each fiber Bragg grating reflects light in one of a plurality of wavelengths each with a selected narrow linewidth. At least two of the fiber Bragg gratings overlap each other in the optical fiber section. The optical fiber section has an end proximate the second facet to receive emitted light therefrom and to reflect light in the plurality of wavelengths with the selected narrow linewidths back into the second facet so that output light is emitted from the first facet in the plurality of wavelengths with the selected narrow linewidths.

Yet another embodiment of the invention is directed to a semiconductor laser source comprising a package housing. A first thermoelectric unit and a second thermoelectric unit are mounted to the package housing. A laser diode has first and second facets from which output light is emitted. The laser diode is mounted to the first thermoelectric unit to maintain the laser diode at a predetermined diode temperature. An optical fiber section has a plurality of fiber Bragg gratings. Each fiber Bragg grating reflects light in one of a plurality of wavelengths each with a selected narrow linewidth at a different wavelength. At least two of the fiber Bragg gratings overlap each other in the optical fiber section. The optical fiber section has an end proximate the second facet to receive emitted light therefrom and to reflect light in the plurality of wavelengths with the selected narrow linewidths back into the second facet so that output light is emitted from the first facet in the plurality of wavelengths with the selected narrow linewidths. The optical fiber section is mounted to the second thermoelectric unit to maintain the optical fiber section at a predetermined fiber temperature.

BRIEF DESCRIPTION OF THE DRAWINGS

FIG. 2b is a graph of the refractive index modulation of the single fiber Bragg gratings of FIG. 2a;

FIG. 3b is a graph of the reflective index modulation of the overlapping fiber Bragg gratings of FIG. 3a;

DETAILED DESCRIPTION OF SPECIFIC EMBODIMENTS

A fiber Bragg grating is an optical fiber in which the propagation constant (or the refractive index) of the core is periodically varied, as symbolically indicated typically by vertical bars. A fiber Bragg grating is designed such that light signals of wavelengths in a narrow linewidth centered about a predetermined wavelengths are reflected in a very narrow linewidth of wavelength. Light at wavelengths outside the narrow linewidth of the fiber Bragg grating simply passes through the grating. Typical fiber Bragg gratings are described in U.S. Pat. No. 5,699,377. Specific embodiments of the present invention increase the number of different wavelengths with narrow linewidths of light reflected in a fiber Bragg grating optical fiber section without increasing the size of the optical fiber section, thereby avoiding the problems associated with the increase in size.

Overlapping Multiple Fiber Bragg Gratings

Figure 1:
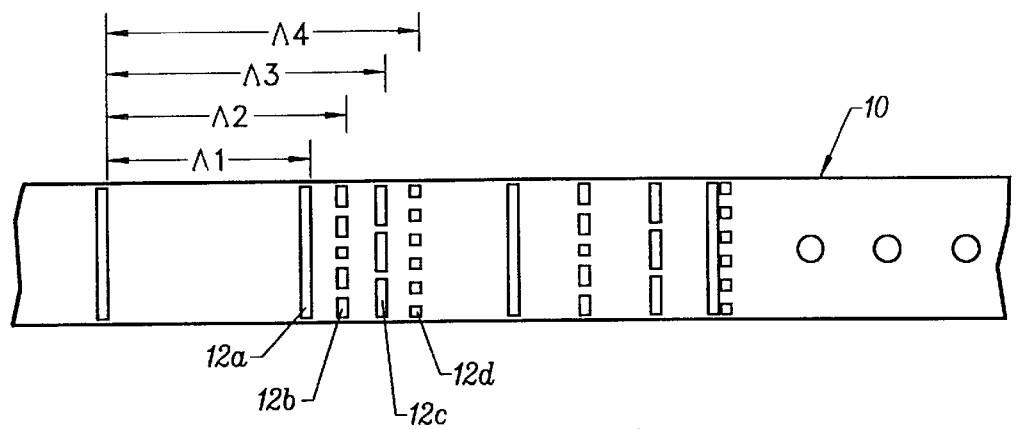
FIG. 1 is a symbolic illustration of an optical fiber section having overlapping multiple fiber Bragg gratings in accordance with an embodiment of the present invention.

In accordance with one embodiment of the present invention, an optical fiber section 10 of FIG. 1 includes a plurality of fiber Bragg gratings 12. The embodiment shown in FIG. 1 has four fiber Bragg gratings 12a, 12b, 12c, 12d. It is understood, however, that the number of gratings can be higher or lower. The periodicity of the fiber Bragg gratings 12 is symbolically indicated by vertical bars and the round continuation symbols to the right of the bars. Four different sets of vertical bars are used for the four different gratings with the periodicity ($\Lambda 1, \Lambda 2, \Lambda 3, \Lambda 4$) of each fiber Bragg grating (12a, 12b, 12c, 12d) indicated by the spacing between the vertical bars for that grating.

Figure 2A:
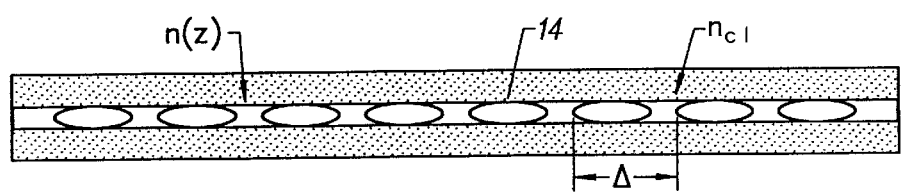
FIG. 2a is a schematic illustration of a single fiber Bragg grating.
Figure 2B:
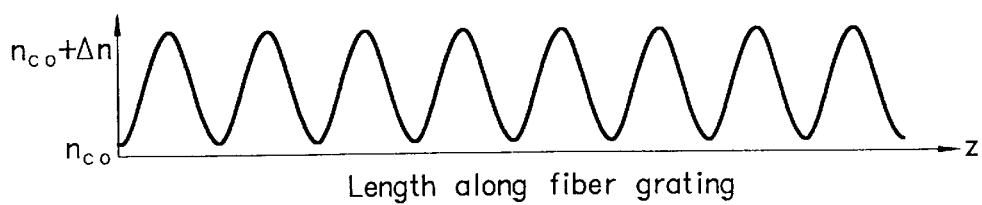

As shown in FIG. 2b, the refractive index modulation of a single fiber Bragg grating (FBG) 14 along the fiber's longitudinal (z) axis as shown in FIG. 2a has the following characteristics:

Refractive index modulation: $nc(z) = nco + \Delta n0 * \sin[2\pi z / \Lambda 0]$, where nco is the fiber core average index, $\Delta n0$ is the peak refractive index modulation, and $\Lambda 0$ is the periodicity of the fiber Bragg grating;

Reflection coupling coefficient: $K = 2\pi \Delta n0 / \lambda X_0$, where $\lambda_0$ is the Bragg wavelength;

Bragg wavelength: $\lambda 0 = 2nco\Lambda 0$;

Reflection of the FBG: $R(z) = [\tanh(K*L)]^2$, where L is the length of the FBG, and ncl is the index of refraction in the cladding of the optical fiber.

Figure 3A:
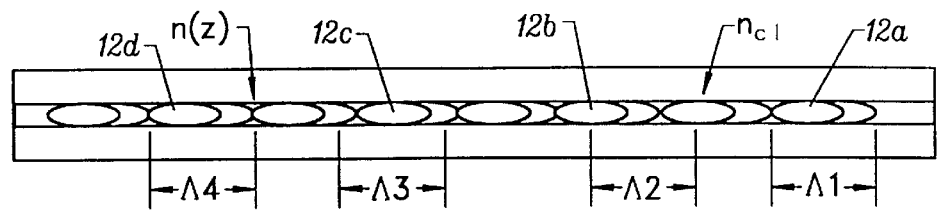
FIG. 3a is a schematic illustration of the optical fiber section having overlapping multiple fiber Bragg gratings of FIG. 1.
Figure 3B:
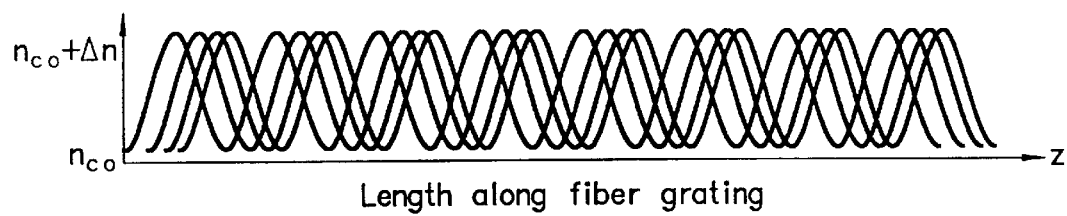

For the overlapping multiple fiber Bragg gratings (multi-FBG) shown in FIG. 3b (having 4 gratings 12a, 12b, 12c, 12d), the refractive index modulation as illustrated in FIG. 3a has the following characteristics:

Refractive index modulation: $nc(z) = nco + \Delta n01 * \sin[2\pi z / \Lambda_1] +$
$\Delta n02 * \sin[2\pi z / \Lambda_2] + \Delta n03 * \sin[2\pi z / \Lambda_3] + \Delta n04 * \sin[2\pi z / \Lambda_4]$, where $\Delta n0i$ [i 1,2,3,4, etc.] is the peak refractive index modulation of each FBG respectively;

Reflection coupling coefficient of each FBG: $K_i = 2\pi \Delta n0i / \lambda_i$, where $\lambda_i$ is the Bragg wavelength of each FBG, i=1,2,3,4, etc.;

Bragg wavelengths: $\lambda_i = 2nco\Lambda_i$, where i=1,2,3,4, etc., nco is the fiber core average index;

Reflection of the multi-FBG: $R(z) \approx [\tanh(K_1 * L_1)]^2 +$
$[\tanh(K_2 * L_2)]^2 +$
$[\tanh(K_3 * L_3)]^2 +$
$[\tanh(K_4 * L_4)]^2 + \ldots;$ where $L_i$ (i=1,2,3,4, etc.) is the length of each FBG. The result is that there are multi-reflection peaks. This holds when $K_i * L_i$ are small, indicating individual peaks with little overlapping.

The overlapping fiber Bragg gratings may be created by overwriting each of the fiber Bragg gratings with a separate phase mask in the optical fiber section 10. Overwriting a fiber Bragg grating in this manner, however, may induce changes of wavelengths, reflectivities, and linewidths of the previous fiber gratings at the same location. Alternatively, a single phase mask which generates the interference patterns for all fiber Bragg gratings could be used. The overlapping fiber Bragg gratings are created at one time by exposure of the UV interference patterns created on the fiber section 10 by the phase mask. Details of the construction of fiber Bragg gratings with phase masks may be found in U.S. application Ser. No. 09/120,870 entitled, "METHOD AND APPARATUS OF MANUFACTURING APODIZED PHASE MASKS AND RELATED DEVICES" (Attorney Ref. No. 013011-007300), filed of even date by J. J. Pan, Feng Qing Zhou and Yuan Shi, and assigned to the present assignee, which application is hereby incorporated by reference in its entirety.

Multiwavelength Laser Diode Source

The overlapping multiple fiber Bragg gratings 12 can be used in various applications that utilize fiber Bragg gratings to reflect light at selected wavelengths with narrow linewidths. Several examples are mentioned above. The following describes an example of one of the applications in detail, but the scope of the invention is not limited by the specific example.

Figure 4:
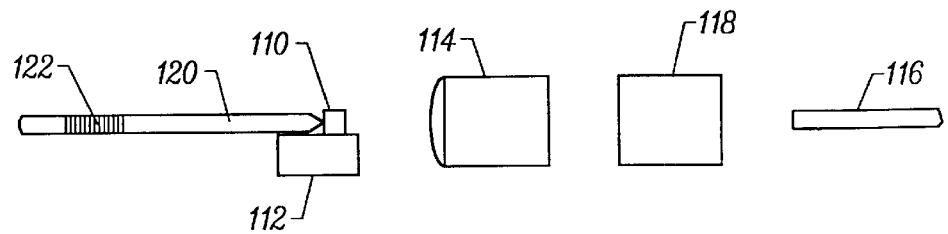
FIG. 4 is a schematic illustration of a general arrangement of elements for a multiwavelength laser diode package assembly incorporating the overlapping multiple fiber Bragg gratings of FIG. 1 according to an embodiment of the present invention.

FIG. 4 shows a general arrangement of elements for a multiwavelength laser diode package assembly according to one embodiment of the present invention. A laser diode 110 is mounted to a base 112. Opposite one facet of the laser diode 110 is a lens complex 114 which receives the light from the laser diode 110 and refocuses the light emitted from the diode to the end, specifically the core, of an output optical fiber 116. An optical isolator subassembly 118, such as a birefringent polarizer/Faraday rotator/birefringent analyzer combination described in U.S. Pat. No. 5,208,876, is fixed between the lens complex 114 and the end of the fiber 116. The optical isolator subassembly 118 blocks light from the fiber 116 from entering the laser diode 110, which is highly sensitive to outside back reflection light interferences.

The second facet of the laser diode 110 is placed near one end of an optical fiber section 120 having overlapping multiple fiber Bragg gratings 122. The optical fiber section 10 having the overlapping grating 12 of FIG. 1 may be used. A microlens (not shown) is desirably formed at the end of the optical fiber section 120 for directing light from the laser diode 110 into the core of the optical fiber section 120. Anti-reflective coatings (not shown) are desirably used to substantially cover the microlens and the surface at the end of the optical fiber section 120 to increase the light transmitted from the laser diode 110 into the core of the optical fiber section 120, and to reduce the back reflection from surfaces of lenses and fiber ends to the laser diode 110. The coating also helps in the transmission of the light reflected back into the laser diode 110 from the gratings 122. Examples of the microlens and anti-reflective coatings are described in U.S. Pat. No. 5,699,377.

Figure 5:
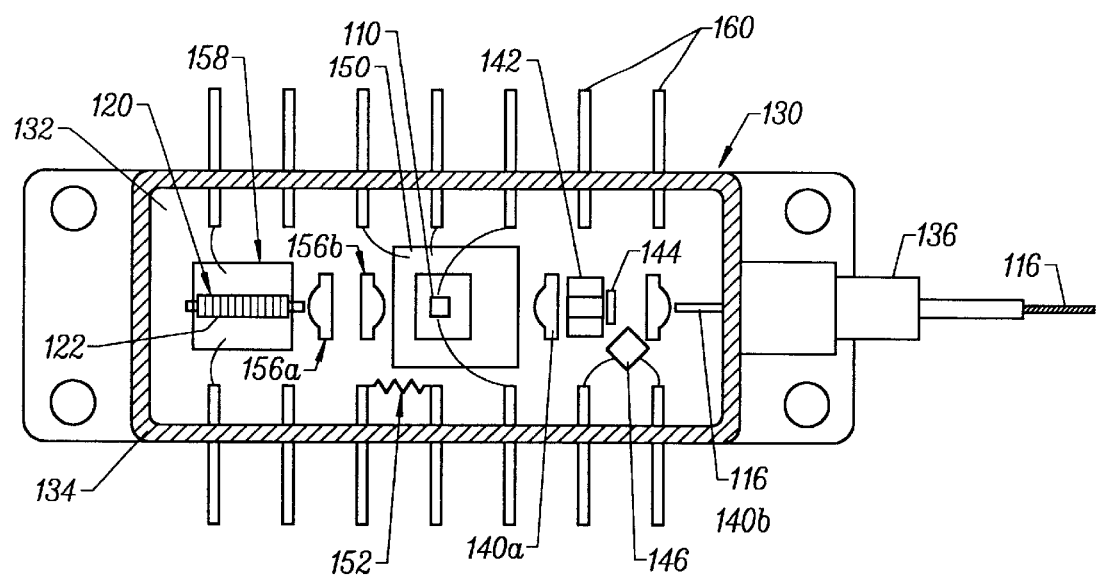
FIG. 5 is a cross-sectional top view of a multiwavelength laser diode package assembly according to the present invention.

FIG. 5 shows a multiwavelength laser diode package assembly known as a butterfly package 130. To further facilitate an understanding of the present invention, the same reference characters from FIG. 4 are used, where possible, to identify the elements which have the same functions as those described with respect to FIG. 4. The package 130 has a base plate 132 with side walls 134. The lid of the package 130 is not shown. A fiber holding fixture 136 mounts into one of the side walls of the package 130 and holds the output fiber 116. The laser diode 110 is fixed to the base 132, along with a pair of spaced aspherical lens collimators 140a, 140b disposed between the laser diode 110 and the output fiber 116. An isolator 142 is disposed between the pair of spaced aspherical collimators. A beam splitter (BS) 144 is placed between the isolator 142 and one of the aspherical collimators 140b to divert some of the laser diode output to a photodiode 146 which is disposed adjacent to the BS 144. The photodiode 146 helps monitor the output from the laser diode 110. The laser diode 110 is mounted to a thermoelectric cooler unit 150 and a thermistor 152 is provided adjacent the thermoelectric cooler unit 150 so that the temperature of the diode 110 can be monitored. The thermistor 152 is used to monitor the temperature of the unit 150 and diode 110 for a feedback control loop of the operation of the thermoelectric cooler unit 150.

To the other side of the laser diode 110 are disposed another pair of spaced aspherical collimators 156a, 156b and the optical fiber section 120 with the overlapping multiple fiber Bragg gratings 122. The section 120 is mounted to another thermoelectric cooler unit 158. Leads 160 provide the electrical connections for the various components of the assembly. For example, the laser diode 110, the thermoelectric cooler units 150, 158, and the photodiode 146 employ such connections. Additionally, the performance of the laser diode package 130 can be improved by coating portions, or all, of the interior of the package with an antireflection coating.

Figure 6:
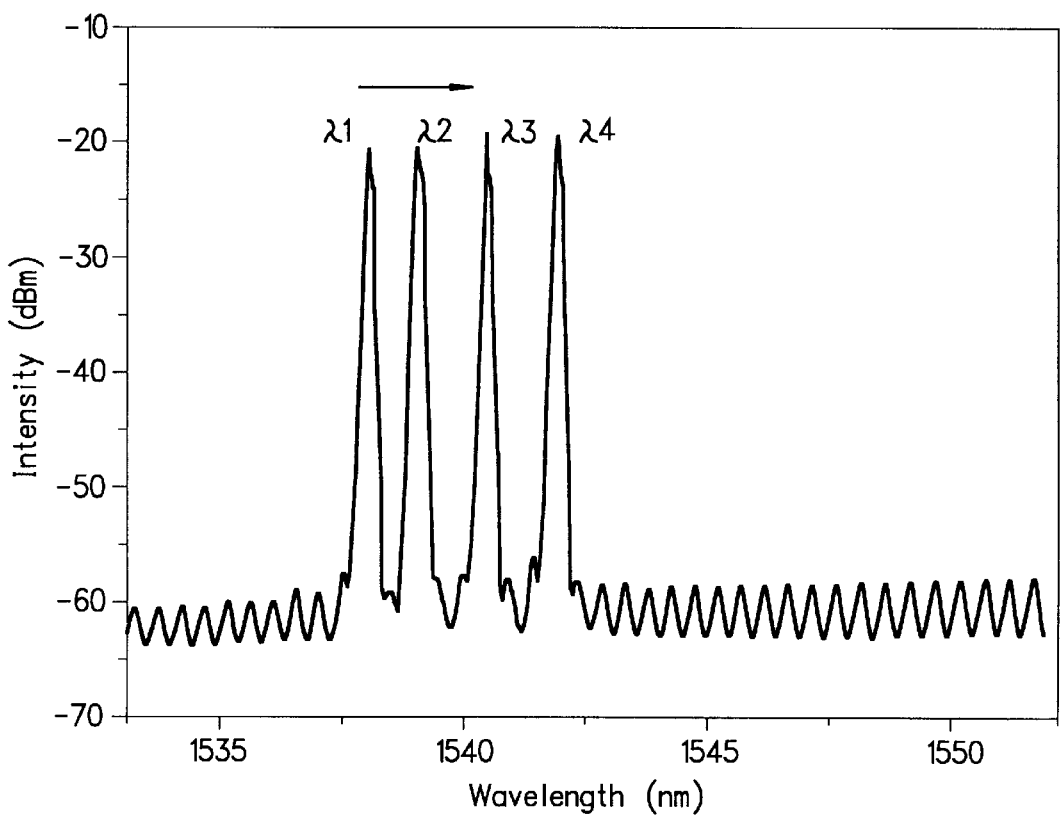
FIG. 6 is a graph of output signal strength versus wavelength for a multiwavelength laser diode package assembly according to the present invention.

FIG. 6 illustrates the multiple narrow linewidth outputs of a laser diode assembly, such as that shown in FIG. 5, in accordance with the invention. The graph in FIG. 6 shows the intensity (dBm) versus wavelength of the output of a laser diode assembly having four overlapping fiber Bragg gratings. The output wavelengths are centered about 1538 nm ($\lambda_1$), 1538.96 nm ($\lambda_2$), 1540.38 nm ($\lambda_3$), and 1541.86 nm ($\lambda_4$) with extremely narrow linewidths. The reflection values are 98.9% ($R_1$), 98.7% ($R_2$), 99% ($R_3$), and 99.1% ($R_4$) for the four fiber Bragg gratings.

The multiwavelength laser diode source can be used for various applications. A few examples of using a 4-wavelength laser diode source 170 are given for illustrative purposes and are not meant to limit the scope of its use. The 4-wavelength laser diode source 170 in the examples includes a built-in isolator.

Figure 7A:
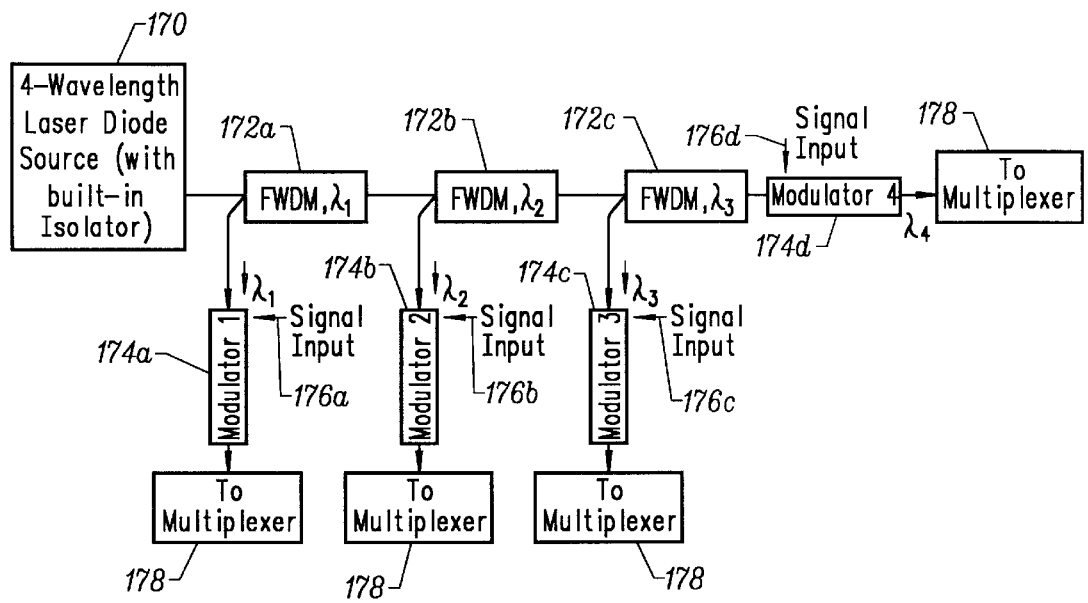
FIG. 7a is a diagram of an arrangement of using a multiwavelength laser source for WDM systems employing filter wavelength division multiplexers.
Figure 7B:
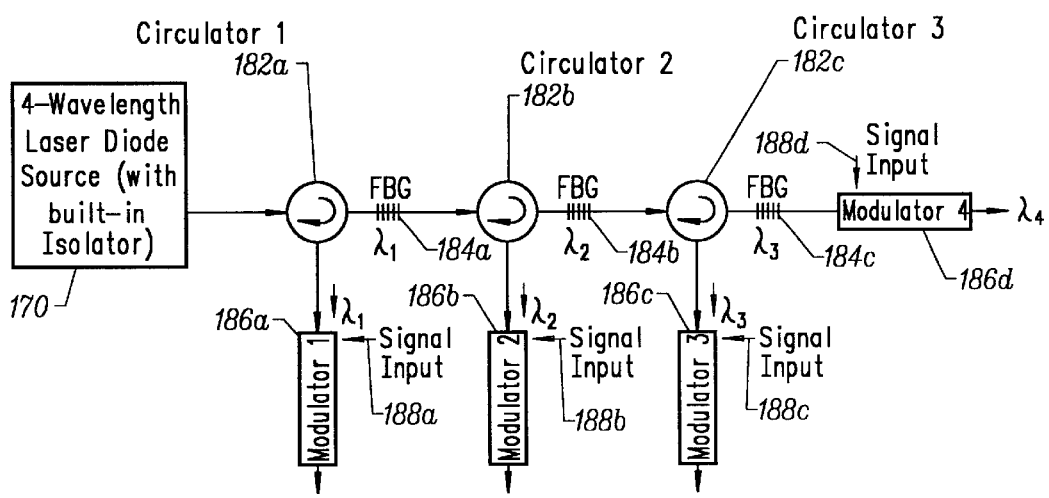
FIG. 7b is a diagram of an arrangement of using a multiwavelength laser source for WDM systems employing circulators.

FIGS. 7a and 7b illustrate two arrangements of using the 4-wavelength laser source 170 for WDM systems. In FIG. 7a, the 4-wavelength laser diode source 170 emits light signals in four wavelengths: $\lambda_1$, $\lambda_2$, $\lambda_3$, and $\lambda_4$. The laser diode source is coupled to three filter wavelength division multiplexers (FWDM) 172a, 172b, 172c in series in a main signal path. Details of FWDM couplers which may be used in these arrangements are described in U.S. Pat No. 5,642,448. The first FWDM 172a diverts the $\lambda_1$ light signal from the main signal path to a first modulator 174a which modulates the $\lambda_1$ light signal in response to an electrical input signal 176a (indicated by an arrow to the modulator). The modulated signal is then directed to a multiplexer 178. Similarly, the second FWDM 172b diverts the $\lambda_2$ light signal to a second modulator 174b which modulates the $\lambda_2$ light signal in response to an electrical input signal 176b for input into the multiplexer 178. The third FWDM 172c diverts the $\lambda_3$ light signal to a third modulator 174c which modulates the $\lambda_3$ light signal in response to an electrical input signal 176c for input into the multiplexer 178. The remaining $\lambda_4$ light signal is modulated by a fourth modulator 174d in response to an electrical input signal 176d and then directed to the multiplexer 178.

In FIG. 7b, the light signals of the 4-wavelength laser diode source 170 are directed to three optical circulators 182a, 182b, 182c in series in a main signal path. The $\lambda_1$ light signal is reflected back to the first circulator 182a by a first fiber Bragg grating 184a selected to reflect light at $\lambda_1$ and disposed between the first circulator 182a and second circulator 182b. The $\lambda_1$ light signal is diverted to a first modulator 186a by the first circulator and is modulated by the first modulator 186a in response to an electrical input signal 188a (indicated by an arrow to the modulator). The modulated signal is then directed to a multiplexer (not shown). Similarly, a second fiber Bragg grating 184b disposed between the second circulator 182b and third circulator 182c reflects the $\lambda_2$ light signal back to the second circulator 182b which diverts it to a second modulator 186b. The second modulator 186b modulates the $\lambda_2$ light signal in response to an electrical input signal 188b for input into the multiplexer (not shown). A third fiber Bragg grating 184c disposed downstream of the third circulator 182c reflects the $\lambda_3$ light signal back to the third circulator 182c which diverts it to a third modulator 186c. The third modulator 186c modulates the $\lambda_3$ light signal in response to an electrical input signal 188c for input into the multiplexer (not shown). The remaining $\lambda_4$ light signal is modulated by a fourth modulator 186d in response to an electrical input signal 188d disposed downstream of the third fiber Bragg grating 184c in the main signal path and then directed to the multiplexer (not shown).

Figure 8A:
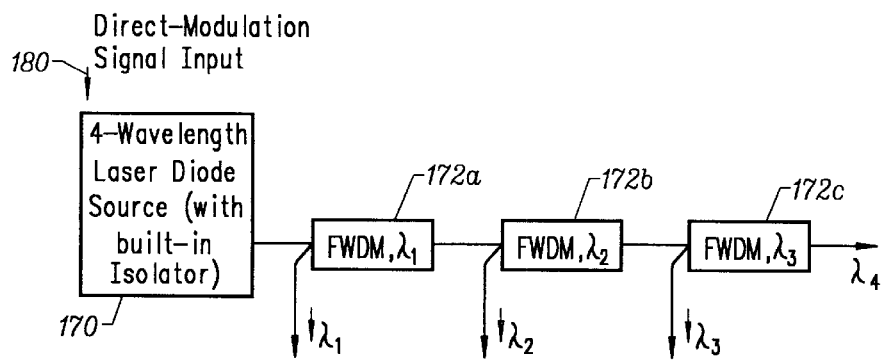
FIG. 8a is a diagram of an arrangement of using a multiwavelength laser source with direct modulation for signal distribution employing filter wavelength division multiplexers.
Figure 8B:
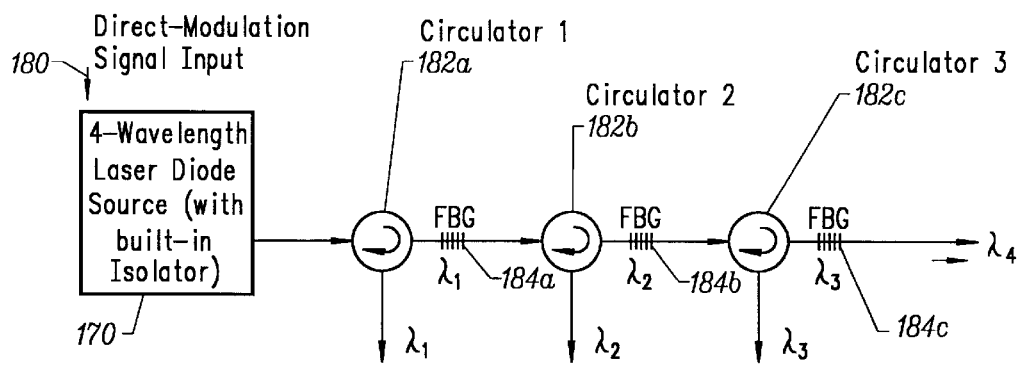
FIG. 8b is a diagram of an arrangement of using a multiwavelength laser source with direct modulation for signal distribution employing circulators.
Figure 8C:
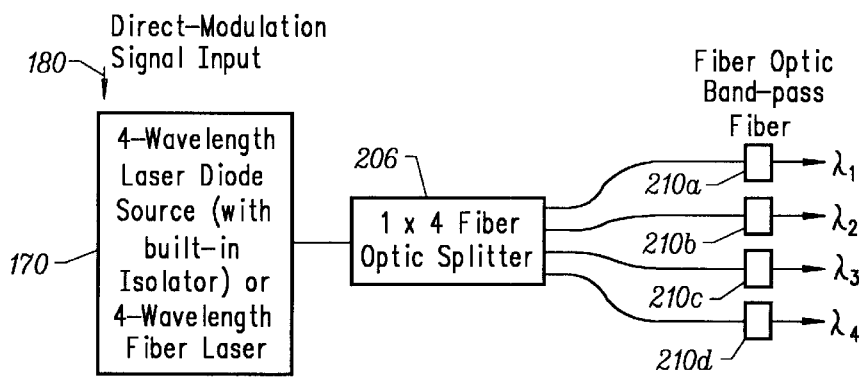
FIG. 8c is a diagram of an arrangement of using a multiwavelength laser source with direct modulation for signal distribution employing a fiber optic splitter.

FIGS. 8a–8c show arrangements of using a 4-wavelength laser diode source 170 with direct modulation for signal distribution. The light signals of the 4-wavelength laser diode source 170 are directly modulated by an electrical input signal 180 (indicated by an arrow to the source). To further facilitate an understanding of the present invention, the same reference characters from FIGS. 7a–7b are used in FIGS. 8a–8b, where possible, to identify the elements which have the same functions as described with respect to FIGS. 7a–7b.

In FIG. 8a, the 4-wavelength laser diode source 170 is coupled in series with three FWDMs 172a, 172b, 172c for diverting respectively $\lambda_1$, $\lambda_2$, and $\lambda_3$ light signals, leaving $\lambda_4$ in the main signal path, in a manner similar to that described above for FIG. 7a. This arrangement results in low loss signal distribution.

The arrangement in FIG. 8b is similar to that in FIG. 7b. The 4-wavelength laser diode source 170 with direct modulation by an electrical input signal 180 is coupled in series with three optical circulators 182a, 182b, 182c. A $\lambda_1$ fiber Bragg grating 184a is disposed downstream of the first circulator 182a, a $\lambda_2$ fiber Bragg grating 184b is disposed downstream of the second circulator 182b, and a third fiber Bragg grating 184c is disposed downstream of the third circulator 182c. The $\lambda_1$, $\lambda_2$, and $\lambda_3$ light signals are respectively diverted by the first circulator 182a, second circulator 182b, and third circulator 182c in a way similar to that described above for FIG. 7b. The remaining $\lambda_4$ signal continues past the $\lambda_3$ fiber Bragg grating 184c in the main signal path.

A third arrangement for signal distribution as shown in FIG. 8c employs a 1×4 fiber optic splitter 206 for splitting the 4-wavelength output light from the laser diode source 170 which is directly modulated by an electrical input signal 180 into four light signals. These four light signals are separately filtered by fiber optic band-pass filters 210a, 210b, 210c, 210d to generate separate $\lambda_1$, $\lambda_2$, $\lambda_3$, and $\lambda_4$ light signals. This arrangement results in high distribution loss. In one preferred embodiment, the $\lambda_1$, $\lambda_2$, $\lambda_3$, and $\lambda_4$ light signals are further modulated by separate modulators with electrical input signals (not shown).

Figure 9A:
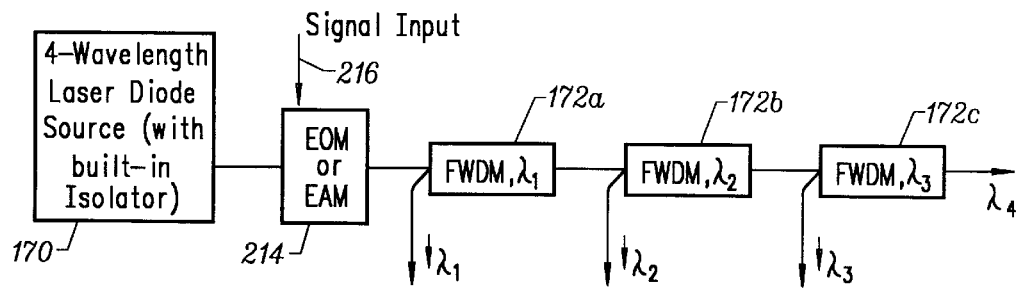
FIG. 9a is a diagram of an arrangement of using a multiwavelength laser source with external modulation for signal distribution employing filter wavelength division multiplexers.
Figure 9B:
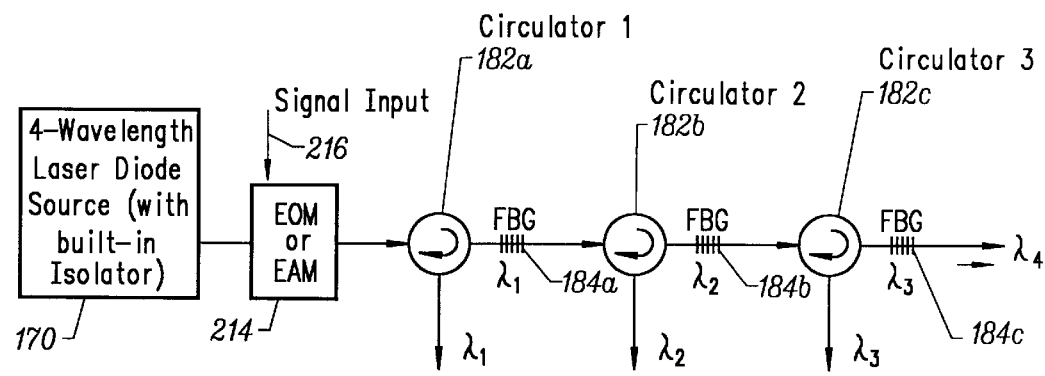
FIG. 9b is a diagram of an arrangement of using a multiwavelength laser source with external modulation for signal distribution employing circulators.
Figure 9C:
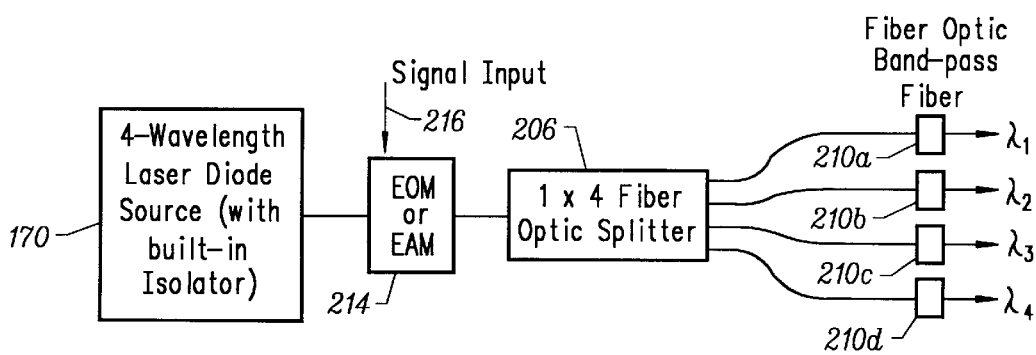
FIG. 9c is a diagram of an arrangement of using a multiwavelength laser source with external modulation for signal distribution employing a fiber optic splitter.

FIGS. 9a–9c show arrangements of using a 4-wavelength laser diode source 170 with external modulation for signal distribution. The arrangements of FIGS. 9a–9c are similar to those of FIGS. 8a–9c, except that external modulation is used instead of direct modulation. The light signals of the 4-wavelength laser diode source 170 are externally modulated by a modulator 214 coupled to the source in response to an electrical input signal 216 (indicated by an arrow to the modulator). The modulator 214 may be EOM (electrooptical modulator) or EAM (electroabsorbtive modulator) types. To further facilitate an understanding of the present invention, the same reference characters from FIGS. 8a–9c are used in FIGS. 9a–9c, where possible, to identify the elements which have the same functions as described with respect to FIGS. 8a–9c.

In FIG. 9a, the 4-wavelength laser diode source 170 and modulator 214 are coupled in series with three FWDMs 172a, 172b, 172c for diverting respectively $\lambda_1$, $\lambda_2$, and $\lambda_3$ light signals, leaving $\lambda_4$ light signals in the main signal path, in a manner similar to that described above for FIG. 8a. This arrangement results in low loss signal distribution.

The arrangement in FIG. 9b is similar to that in FIG. 8b. The 4-wavelength laser diode source 170 and modulator 214 are coupled in series with three optical circulators 182a, 182b, 182c. A $\lambda_1$ fiber Bragg grating 184a is disposed downstream of the first circulator 182a, a $\lambda_2$ fiber Bragg grating 184b is disposed downstream of the second circulator 182b, and a third fiber Bragg grating 184c is disposed downstream of the third circulator 182c. The $\lambda_1$, $\lambda_2$, and $\lambda_3$ light signals are respectively diverted by the first circulator 182a, second circulator 182b, and third circulator 182c. The remaining $\lambda_4$ signal continues past the $\lambda_3$ fiber Bragg grating 184c in the main signal path.

A third arrangement for signal distribution as shown in FIG. 9c employs a 1×4 fiber optic splitter 206 for splitting the externally modulated 4-wavelength output light from the laser diode source 170 into four light signals, similar to the arrangement of FIG. 8c. These four light signals are separately filtered by fiber optic band-pass filters 210a, 210b, 210c, 210d to generate separate $\lambda_1$, $\lambda_2$, $\lambda_3$, and $\lambda_4$ light signals. This arrangement results in high distribution loss.

Figure 10:
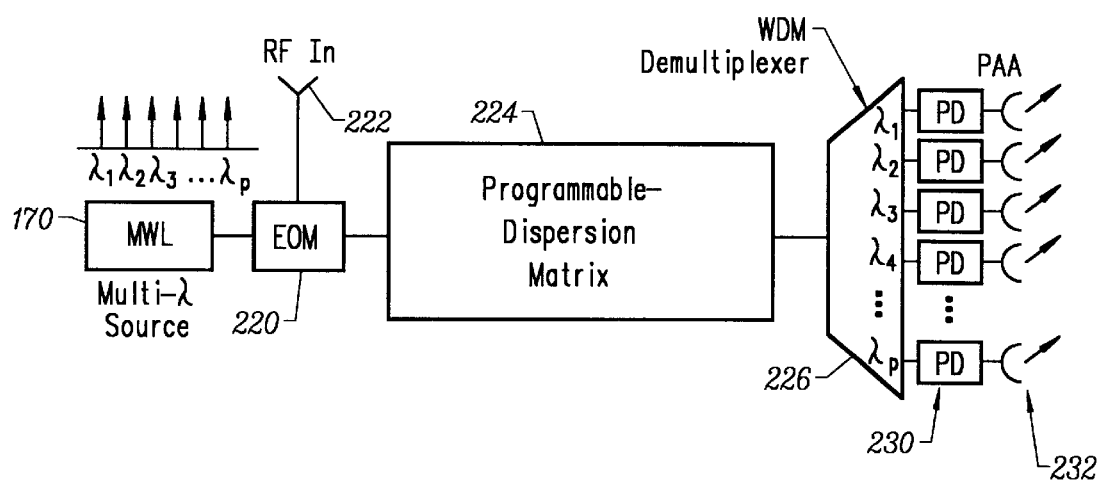
FIG. 10 is a diagram of an arrangement of using a multiwavelength laser source with external modulation for a phased array application.

FIG. 10 shows an arrangement employing the multiwavelength laser source 170 with external modulation for a phased array application. The source 170 generateslight signals at p wavelengths: $\lambda_1, \lambda_2, \ldots \lambda_p$. The light signals are externally modulated with a modulator coupled to the source 170. FIG. 10 shows an EOM 220 which receives the light signals from the laser source 170 and an RF (radio frequency) input signal 222. The modulated input is directed through a programmable-dispersion matrix 224 to a WDM demultiplexer 226. The WDM demultiplexer 226 is connected to a set of p receivers, each formed by a photodiode 230 and a phased array antenna (PAA) 232. This arrangement finds important commercial applications in various communications systems, wireless communications, and remote networks.

While the description above provides a full and complete disclosure of the preferred embodiments of the present invention, various modifications, alternate constructions, and equivalents will be obvious to those with skill in the art. For example, while specific embodiments of a multiwavelength laser diode source having overlapping multiple fiber Bragg gratings were disclosed, it is evident that other applications such as multiwavelength fiber lasers, reflectors, and multiplexers/demultiplexers would also have the increased performance envisioned by the present invention. Thus, the scope of the present invention is limited solely by the metes and bounds of the appended claims.

What is claimed is:

1. An optical fiber section comprising a plurality of fiber Bragg gratings, each fiber Bragg grating reflecting light in a wavelength with a selected narrow linewidth which is different from another wavelength of light reflected by another one of the fiber Bragg gratings, at least two of said fiber Bragg gratings physically overlapping each other in said optical fiber section.

2. The optical fiber section of claim 1 wherein all said plurality of fiber Bragg gratings physically overlap each other in said optical fiber section.

3. An optical fiber section comprising a plurality of fiber Bragg gratings, each fiber Bragg grating having a selected period so as to reflect light in a wavelength with a selected narrow linewidth, one of the fiber Bragg gratings having a selected period which is different from another selected period of another one of the fiber Bragg gratings, at least two of said fiber Bragg gratings physically overlapping each other in said optical fiber section.

4. The optical fiber section of claim 3 including four fiber Bragg gratings having four selected periods.

5. A semiconductor laser source comprising:
a laser diode having first and second facets from which output light is emitted; and
an optical fiber section having a plurality of fiber Bragg gratings, each fiber Bragg grating reflecting light in a wavelength with a selected narrow linewidth which is different from another wavelength of light reflected by another one of the fiber Bragg gratings, at least two of said fiber Bragg gratings physically overlapping each other in said optical fiber section, said optical fiber section having an end proximate said second facet to receive emitted light therefrom and to reflect light in each said wavelength with said selected narrow linewidth back into said second facet so that output light is emitted from said first facet in a plurality of wavelengths with selected narrow linewidths.

6. The semiconductor laser source of claim 5 wherein said optical fiber section has a core, further comprising a lens focussing light output from said second facet into said core.

7. The semiconductor laser source of claim 6 wherein said end of said optical fiber section and said lens are substantially covered with a coating of anti-reflection material.

8. The semiconductor laser source of claim 5 further comprising:
an output optical fiber-having an end;
a lens intermediate said first facet and said end of said output optical fiber, said lens focussing light output emitted from said first facet into said end of said output optical fiber; and
an optical isolator subassembly intermediate said first facet and said end of said output optical fiber, said optical isolator subassembly passing light from said first facet toward said end of said output optical fiber and blocking light from said end of said output optical fiber toward said first facet.

9. The semiconductor laser source of claim 5 wherein each of said fiber Bragg gratings has a selected period so as to reflect light in each said wavelength with said selected narrow linewidth.

10. A semiconductor laser source comprising:
a package housing;
a first thermoelectric unit and a second thermoelectric unit mounted to said package housing;
a laser diode having first and second facets from which output light is emitted, said laser diode mounted to said first thermoelectric unit to maintain said laser diode at a predetermined diode temperature; and
an optical fiber section having a plurality of fiber Bragg gratings, each fiber Bragg grating reflecting light in one of a plurality of wavelengths each with a selected narrow linewidth which is different from another wavelength of light reflected by another one of the fiber Bragg gratings, at least two of said fiber Bragg gratings physically overlapping each other in said optical fiber section, said optical fiber section having an end proximate said second facet to receive emitted light therefrom and to reflect light in each said wavelength with said selected narrow linewidth back into said second facet so that output light is emitted from said first facet in said plurality of wavelengths with said selected narrow linewidths, said optical fiber section mounted to said second thermoelectric unit to maintain said optical fiber section at a predetermined fiber temperature.

11. The semiconductor laser source of claim 10 wherein each of said fiber Bragg gratings has a selected period so as to reflect light in each said wavelength with said selected narrow linewidth.

12. The semiconductor laser source of claim 10 further comprising a photodiode mounted to said package proximate said optical isolator subassembly, said photodiode monitoring light output from said first facet of said laser diode.

13. A fiberoptic network system comprising:
a semiconductor laser source having a plurality of fiber Bragg gratings, each fiber Bragg grating reflecting light in one of a plurality of wavelengths each with a selected narrow linewidth, at least two of said fiber Bragg gratings overlapping each other in said optical fiber section, said semiconductor laser source producing output light signals in said plurality of wavelengths with said selected narrow linewidths at an output;
a signal distribution device receiving and separating said output light signals according to said plurality of wavelengths with said selected narrow linewidths.

14. The fiberoptic network system of claim 13 wherein said signal distribution device comprises a plurality of filter wavelength division multiplexers connected in series with said output of said semiconductor laser source, each said filter wavelength division multiplexer separating light signals according to one of said plurality of wavelengths with said selected narrow linewidth.

15. The fiberoptic network system of claim 13 wherein said signal distribution device comprises a plurality of sets of an optical circulator disposed upstream of a fiber Bragg grating, said plurality of sets connected in series with said output of said semiconductor laser source, said fiber Bragg grating in each set reflecting light signals in one of said wavelengths with said selected narrow linewidth back to said optical circulator in said set for separating said reflected light signals.

16. The fiberoptic network system of claim 13 wherein said signal distribution device comprises an fiber optic splitter connected to said output of said semiconductor laser source, said fiber optic splitter separating said output light signals.

17. The fiberoptic network system of claim 16 wherein said separated light signals are separately filtered by fiber optic band-pass filters according to said plurality of wavelengths with said selected narrow linewidths.

18. The fiberoptic network system of claim 13 wherein said semiconductor laser source is directly modulated by electrical signals.

19. The fiberoptic network system of claim 13 wherein said separated light signals are modulated by electrical signals.

20. The fiberoptic network system of claim 19 wherein said modulated separated light signals are directed to a multiplexer.

21. A fiberoptic network system comprising:
- a semiconductor laser source having a plurality of fiber Bragg gratings, each fiber Bragg grating reflecting light in one of a plurality of wavelengths each with a selected narrow linewidth, at least two of said fiber Bragg gratings overlapping each other in said optical fiber section, said semiconductor laser source producing output light signals in said plurality of wavelengths with said selected narrow linewidths;
- a modulator receiving radio frequency input signals and coupled to said semiconductor laser source for receiving said output light signals to generate modulated output signals;
- a programmable-dispersion matrix having an input connected to said modulator for receiving said modulated output signals and producing matrix output signals at an output;
- a WDM demultiplexer having an input connected to said output of said programmable-dispersion matrix and a plurality of outputs, said WDM demultiplexer separating said matrix output signals from said input to one of said outputs corresponding to one of said plurality of wavelengths with said selected narrow linewidth; and
- a plurality of receivers, each receiver having an input connected to one of said outputs of said WDM demultiplexer to receive said separated signals at one of said plurality of wavelengths with said selected narrow linewidth.

22. The fiberoptic network system of claim 21 wherein said plurality of receivers each comprise a photodiode receiving said separated signals and converting said separated signals into electrical signals, and a transmitter responsive to said electrical signals generating light signals at one of said plurality of wavelengths with said narrow linewidth.

23. The fiberoptic network system of claim 22 wherein said transmitter comprises a phased array antenna.

* * * * *